US008638953B2

(12) United States Patent
Jonsson et al.

(10) Patent No.: US 8,638,953 B2
(45) Date of Patent: Jan. 28, 2014

(54) SYSTEMS AND METHODS FOR GENERATING PHANTOM BASS

(75) Inventors: Ragnar H Jonsson, Laguna Niguel, CA (US); Trausti Thormundsson, Irvine, CA (US); Harry K Lau, Norwalk, CA (US)

(73) Assignee: Conexant Systems, Inc., Irvine, CA (US)

( * ) Notice: Subject to any disclaimer, the term of this patent is extended or adjusted under 35 U.S.C. 154(b) by 713 days.

(21) Appl. No.: 12/833,606

(22) Filed: Jul. 9, 2010

(65) Prior Publication Data

US 2012/0008788 A1 Jan. 12, 2012

(51) Int. Cl.
*H03G 5/00* (2006.01)

(52) U.S. Cl.
USPC .......... 381/98; 381/61

(58) Field of Classification Search
USPC .......... 381/17, 97–99, 61–62
See application file for complete search history.

(56) References Cited

U.S. PATENT DOCUMENTS 4,972,489 A * 11/1990 Oki et al. .......... 381/97
5,900,570 A 5/1999 Rossum
7,394,908 B2 * 7/2008 Katou et al. .......... 381/98
8,094,835 B2 * 1/2012 Shimura et al. .......... 381/94.1
8,280,075 B2 * 10/2012 Asada et al. .......... 381/98
2004/0071297 A1 4/2004 Katou et al.
2005/0013446 A1 * 1/2005 Aarts .......... 381/61
2007/0253576 A1 11/2007 Bai et al.
2008/0170719 A1 7/2008 Shimura et al.
2008/0175409 A1 * 7/2008 Lee et al. .......... 381/98
2008/0292114 A1 11/2008 Shimura et al.
2010/0086148 A1 * 4/2010 Hung et al. .......... 381/98

OTHER PUBLICATIONS

European Patent Office; International Search Report and Written Opinion; PCT Application No. PCT/US2011/043239; Oct. 6, 2011.
The International Bureau of WIPO; International Preliminary Report on Patentability; PCT Application No. PCT/US2011/043239; Jan. 24, 2013.

* cited by examiner

*Primary Examiner* — Disler Paul
(74) *Attorney, Agent, or Firm* — Jackson Walker L.L.P.; Christopher J. Rourk

(57) ABSTRACT

In many audio playback systems, frequencies below a given cut off frequency are suppressed either due to speaker constraints or safety constraints. For example, some speakers are only capable of generating signals above a certain frequency. Prolonged low frequency sound can cause damage to speakers or other components. An audio driver can be equipped with a phantom bass module which by doubling, tripling and/or quadrupling frequencies below a cutoff frequency can simulate the bass experience. The doubling, tripling and quadrupling methods disclosed provide a low complexity formulation of a frequency doubling, tripling and quadrupling. In addition, the frequency doubling, tripling and quadrupling formulations are easily adapted to multi-rate processing, where computational savings can be very high.

19 Claims, 12 Drawing Sheets

SYSTEMS AND METHODS FOR GENERATING PHANTOM BASS

BACKGROUND OF THE INVENTION

1. Field of the Invention

The present invention relates generally to audio reproductions and specifically to the enhancement of the audio experience by introducing phantom bass.

2. Related Art

In many audio systems, such as in a laptop computer, the speakers are limited to frequencies above a given threshold frequency. Either the speaker cannot reproduce audio frequencies below the given threshold or is prevented from producing audio frequencies below the given threshold. Often, speakers are prevented from operating below the given threshold frequency because low frequencies can cause detrimental effects to the device. For instance, there is a suspicion in the industry that low frequencies produced by a laptops audio system can degrade the life of a hard disc.

FIG. 1 illustrates a typical audio system used in devices such as laptop computers. The audio driver comprises high pass filter 102 which attenuates frequencies below a given threshold, digital to audio converter (DAC) 104 which converts a digital signal into an analog signal, and analog stages 106 which drive speaker 108. Analog stages 106 often comprise an amplifier and an output stage. In other audio systems an analog high pass filter is used instead of high pass filter 102 and placed after DAC 104 in the audio path.

However, because frequencies below a given threshold are suppressed, the listener may experience a lack of “bass.” Techniques known as “phantom bass” or “virtual bass” are used to reconstitute the bass lost due to the suppression of low frequencies in the audio signal.

SUMMARY OF INVENTION

A phantom bass module can be implemented in an audio driver to accentuate the low frequency experience of a listener. Frequencies below a given cut off frequency are suppressed either due to speaker constraints or safety constraints. For example, some speakers are only capable of generating signals above a certain frequency. Prolonged low frequency sound can do damage to speakers or other components.

The phantom bass module comprises a frequency doubler which uses a band pass filter to select low frequency components in a given audio signal to double. A doubler module doubles the frequency of the filtered input signal by apply a frequency doubling formula derived from the $\oplus$ operator or the $\hat{\oplus}$ operator over a predetermined window size. The resultant output from the doubler module is then band pass filtered to insure only the desirable frequency components are permitted to pass. Optionally, the magnitude of the double frequency signal can be controlled by using a gain element.

The phantom bass module can further comprise a frequency tripler which uses a band pass filter to select low frequency components in the given audio signal to triple and a band pass filter at the output of the tripling process to insure only the desirable frequency components are permitted to pass. Optionally, the magnitude of the triple frequency signal can be controlled by using another gain element. The tripling process can comprise a frequency doubling module and a multiplier module which implements formulae comprising either the $\oplus$ operator or the $\hat{\oplus}$ operator over a predetermined window size. The multiplier module has the effect of frequency adding, so a doubled frequency signal can be mixed with the multiplier module with an input signal to create a tripled frequency signal. A band pass filter is inserted between the doubling module and the multiplier module. The tripling process, alternatively, could comprise a frequency tripling module which implements a formula comprising two operators each operator can be selected as either the $\oplus$ operator or the $\hat{\oplus}$ operator over a predetermined window size. The window size for each of the two operators can be different but are often the same.

The phantom bass module can further comprise a frequency quadrupler which uses a band pass filter to select low frequency components in the given audio signal to quadruple and a band pass filter at the output of the quadrupling process to insure only the desirable frequency components are permitted to pass. Optionally, the magnitude of the quadrupling frequency signal can be controlled by using another gain element. The quadrupling process can comprise two frequency doubling module with a band pass filter in between. Alternatively, the quadrupling process can comprise a frequency doubling module followed by two multiplier modules with a band pass filter in between each. Another alternative is to use a frequency tripling module followed by a multiplier module with a band pass filter in between. Yet another alternative is to use a frequency quadrupling module which implements a formula comprising three operators each operator can be selected as either the $\oplus$ operator or the $\hat{\oplus}$ operator over a predetermined window size. The window size for each of the three operators can be different but are often the same.

In the case of the frequency doubler, tripler and quadrupler, considerable computational savings can be realized by downsampling the isolated input signal. Because, bass frequencies are low, less samples are needed to capture the signal information, as a result, bass frequencies can be downsampled by as much as 40. After the phantom bass processing is complete, the signals can be upsampled to they can be reintroduced into the audio stream. The result is an even greater savings in computation. Furthermore, the downsampling can be incorporated into the doubling, tripling, quadrupling and multiplier formula further simplifying the phantom bass architecture.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure.

Figure 1:
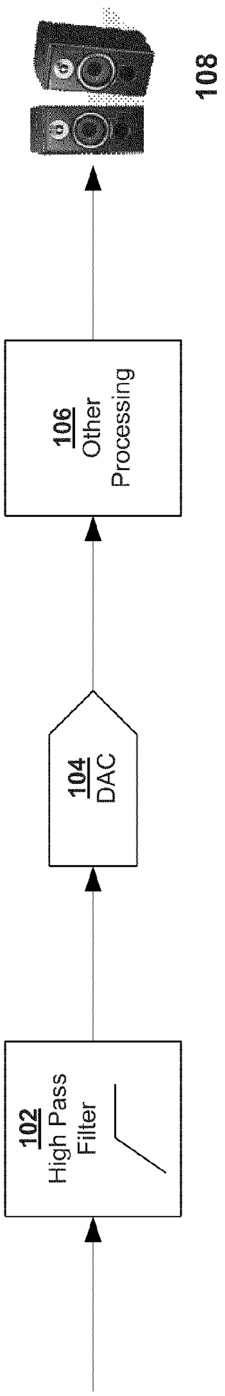
FIG. 1 (Prior Art)
FIG. 1 illustrates a typical audio system used in devices such as laptop computers.
Figure 2:
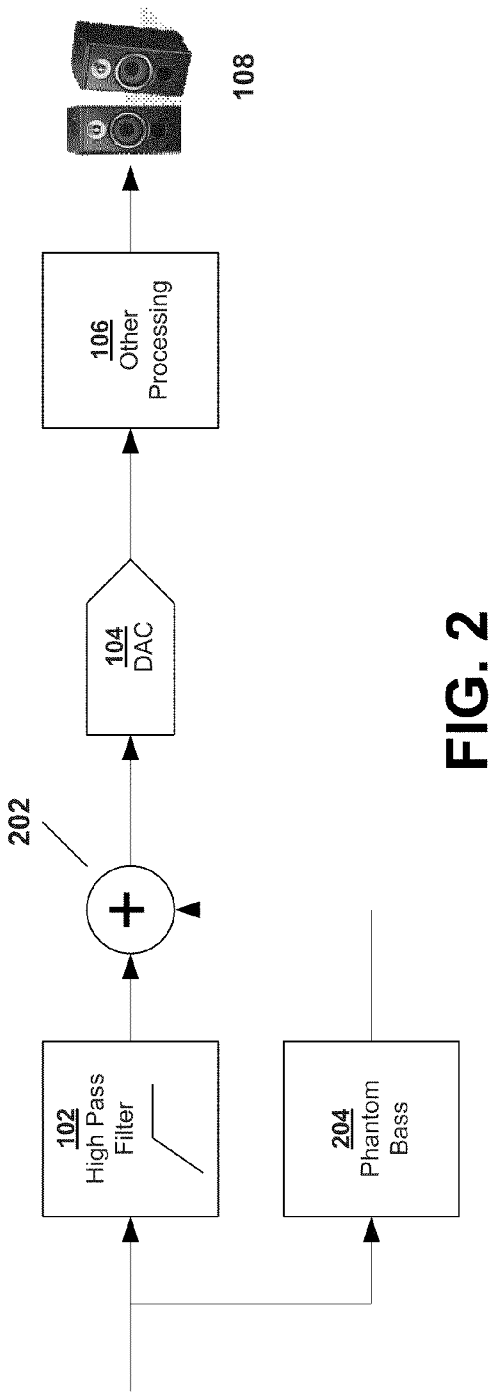
FIG. 2 illustrates an embodiment of an audio driver with a phantom bass module.

FIG. 2 illustrates an embodiment of an audio driver with a phantom bass module. The audio signal prior to being filtered by high pass filter 102 is supplied to phantom bass module 204 which generates a phantom bass signal which is added to the filtered audio signal by mixer 202. Most phantom bass modules use some frequencies below given threshold to generate a phantom bass signal comprising frequencies above the threshold. Effects such as frequency doubling and tripling are often used. Frequency doubling and tripling can be computationally expensive.

Figure 3:
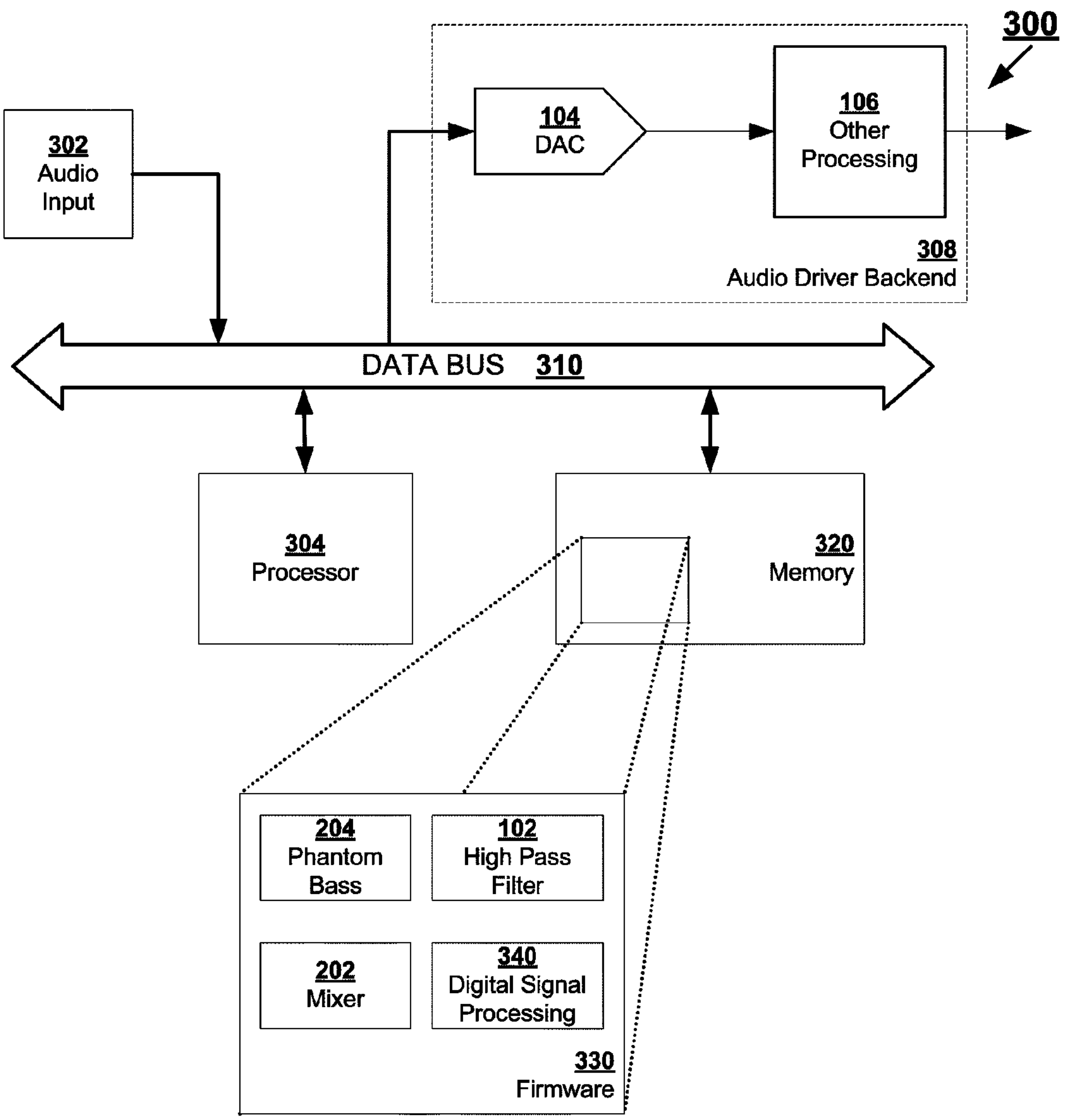
FIG. 3 is a diagram illustrating an embodiment of an audio driver.

FIG. 3 is a diagram illustrating an embodiment of an audio driver. In this implementation, audio driver 300 comprises memory 320, processor 304, and audio input interface 302, and audio driver backend 308 wherein each of these devices is connected across one or more data buses 310. Though the illustrative embodiment shows an implementation using a separate processor and memory, other embodiments include an implementation purely in software as part of an application, and an implementation in hardware using signal processing components, such as filters and mixers.

Audio driver backend 308 comprises DAC 104 and other analog processing modules 106 which can include amplifiers and output drivers. Audio input interface 302 receives a digital audio signal which can be provided by an application such as a music or video playback application or a cellular telephone receiver. Processor 304 can include a central processing unit (CPU), an auxiliary processor associated with the audio system, a semiconductor based microprocessor (in the form of a microchip), a macroprocessor, one or more application specific integrated circuits (ASICs), digital logic gates, a digital signal processor (DSP) or other hardware for executing instructions.

Memory 320 can include any one of a combination of volatile memory elements (e.g., random-access memory (RAM) such as DRAM, and SRAM) and nonvolatile memory elements (e.g., flash, read only memory (ROM), or nonvolatile RAM). Memory 320 stores one or more separate programs, each of which includes an ordered listing of executable instructions for implementing logical functions to be performed by processor 304. The executable instructions include firmware 330 which comprises instructions for phantom bass 204, high pass filter 102, and mixer 202. Firmware 330 can also comprise other digital signal processing functions (340) that may be supported by audio driver 300 such as equalization and filtering. In alternate embodiments, the logic for performing these processes can be implemented in hardware or a combination of software and hardware.

Figure 4:
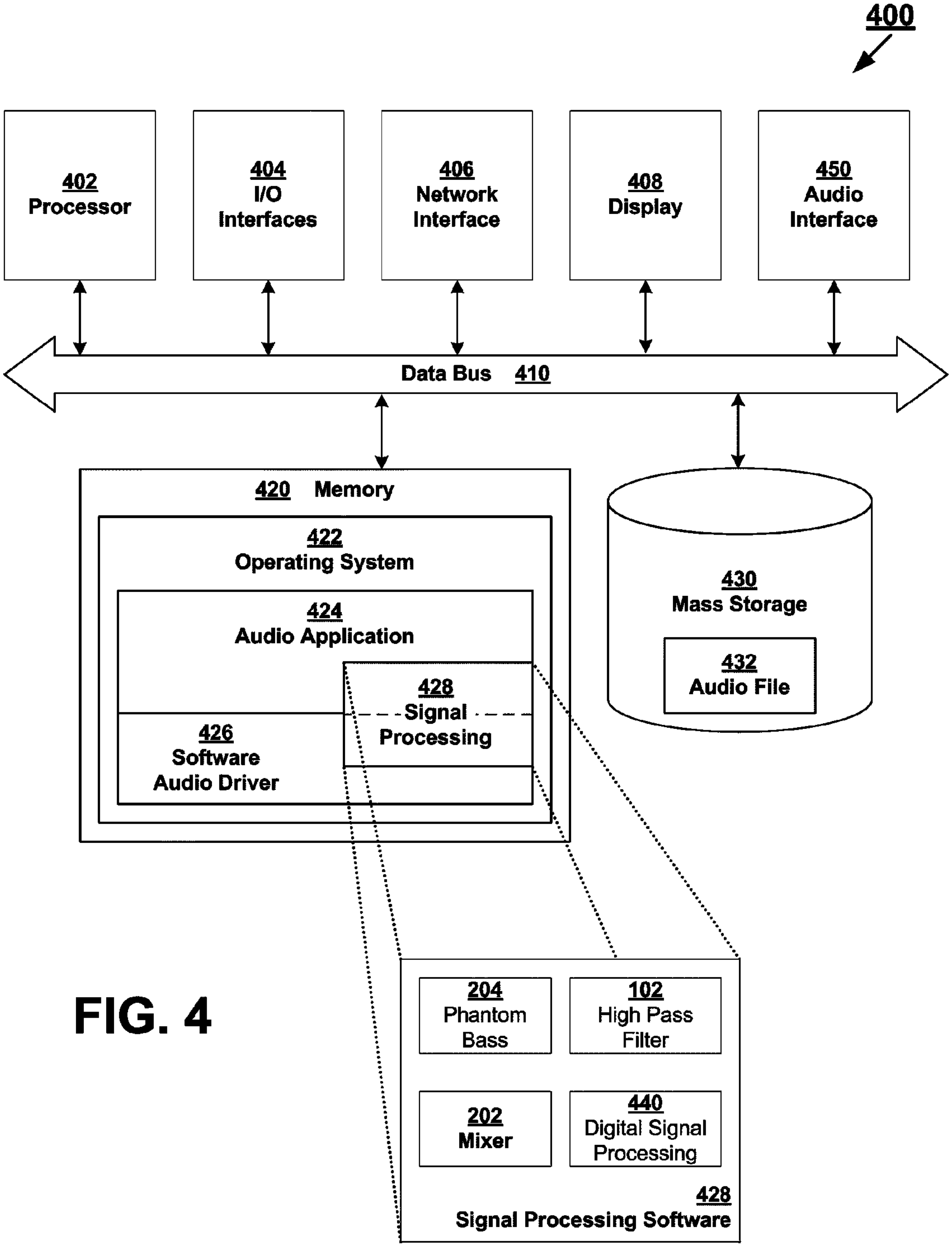
FIG. 4 illustrates an embodiment of a PC equipped with phantom bass audio enhancement.

In another embodiment, hardware audio drivers are not available for modification, so the phantom bass can be implemented in software aboard a personal computer (PC) which is interfaced to a sound card. FIG. 4 illustrates an embodiment of a PC equipped with phantom bass audio enhancement. Generally speaking, PC 400 can comprise any one of a wide variety of computing devices, such as a desktop computer, portable computer, dedicated server computer, multiprocessor computing device, cellular telephone, PDA, handheld or pen based computer, embedded appliance and so forth. Regardless of its specific arrangement, PC 400 can, for instance, comprise memory 420, processor 402, a number of input/output interfaces 404, and mass storage 430, audio interface 450 for communicating with a sound card or hardware audio driver, wherein each of these devices is connected across one or more data buses 410. Optionally, PC 400 can also comprise network interface device 406 and display 408, also connected across one or more data buses 410.

Like in the hardware driver described above, processor 402 can include a CPU, an auxiliary processor associated with the audio system, a semiconductor based microprocessor, a macroprocessor, one or more ASICs, digital logic gates, a DSP or other hardware for executing instructions.

Input/output interfaces 404 provide any number of interfaces for the input and output of data. For example, these components may interface with a user input device (not shown), which may be a keyboard or a mouse. In other examples especially a handheld device (e.g., PDA, mobile telephone), these components may interface with function keys or buttons, a touch sensitive screen, a stylus, etc. Display 408 can comprise a computer monitor or a plasma screen for a PC or a liquid crystal display (LCD) on a hand held device, for example.

Network interface device 406 comprises various components used to transmit and/or receive data over a network environment. By way of example, these may include a device that can communicate with both inputs and outputs, for instance, a modulator/demodulator (e.g., a modem), wireless (e.g., radio frequency (RF)) transceiver, a telephonic interface, a bridge, a router, network card, etc.

Memory 420 can include any one of a combination of volatile memory elements and nonvolatile memory elements. Mass storage 430 can also include nonvolatile memory elements (e.g., flash, hard drive, tape, rewritable compact disc (CD-RW), etc.). Memory 420 comprises software which may include one or more separate programs, each of which includes an ordered listing of executable instructions for implementing logical functions. Often, the executable code can be loaded from nonvolatile memory elements including from components of memory 420 and mass storage 430. Specifically, the software can include native operating system 422, one or more native applications, emulation systems, or emulated applications for any of a variety of operating systems and/or emulated hardware platforms, emulated operating systems, etc. These may further include audio application 424 which may be either a stand-alone application or a plug-in. These may further include software audio driver 426 which is used by applications to communicate with a hardware audio driver. Audio driver 426 can further comprise signal processing software 428 which comprises phantom bass 204, high pass filter 102 and mixer 202. Signal processing software 428 can also comprise other digital signal processing module(s) 440 for function such equalization and noise reduction. Alternatively, audio application 424 comprises signal processing software 428. It should be noted, however, that the logic for performing these processes can also be implemented in hardware or a combination of software and hardware.

Mass storage 430 can be formatted into one of a number of file systems which divide the storage medium into files. These files can include audio files 432 which can hold sound samples such as songs that can be played back. The sound files can be stored in a wide variety of file formats including but not limited to RIFF, AIFF, WAV, MP3 and MP4.

One method to generate phantom bass is to double frequencies between $$\frac{f}{2}$$

and f where f is the given cutoff frequency, so audio frequencies in this frequency range map to frequencies between f and 2f. This can further be enhanced by tripling frequencies between $$\frac{f}{3} \text{ and } \frac{f}{2},$$

so that audio frequencies in this range map to frequencies between f and $$\frac{3f}{2}.$$

This process can utilize even lower frequencies by quadrupling and so forth.

Figure 5:
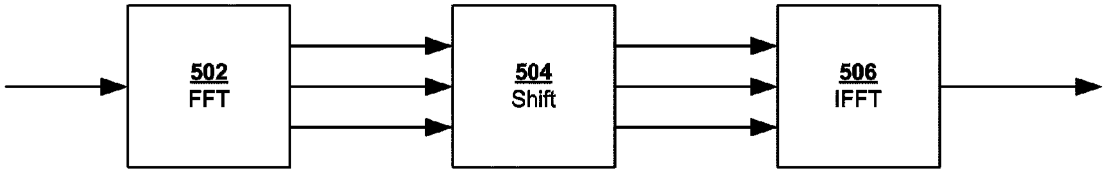
FIG. 5 illustrates a frequency domain implementation of phantom bass.

One straightforward method of implementing the phantom bass method described above is to perform the frequency multiplication operations in the frequency domain. FIG. 5 illustrates a frequency domain implementation of phantom bass. It comprises fast Fourier transform (FFT) 502 which converts the audio signal into frequency components, shift module 504 which selectively shifts frequencies and inverse FFT (IFFT) 506 which converts frequency components back into a time-domain audio signal. Shift module 504 can double, triple frequency components simply by shifting the frequency components. Another benefit of operating in the frequency domain is that the high pass filter can simply be implemented by multiplying a desired gain profile with the frequency components.

However, the phantom base module shown in FIG. 5 has several shortcomings. First, computing an FFT can be computationally expensive. Second in order to practically implement this phantom base module, the time domain signal needs to be broken into windows, where the FFT is performed on each window. As a result, there is at least a delay in the system of N samples where N is the size of the window. Third, the FFT has to have very high frequency resolution to avoid artifacts associated with frequencies that are between frequency bins of the FFT (i.e., frequencies that are not center frequencies in the FFT frequency bins). Additionally, by using windows, discontinuities can arise between windows leading to audible artifacts. While the discontinuities can be address using known windowing techniques, this further increases the computational complexity of this approach.

A time domain approach can address the discontinuity and reduced delay issues. Additionally, a low complexity time domain approach can significantly reduce the overall complexity of a phantom bass system. The embodiments of the phantom bass set forth herein employ a time domain approach and use the $\oplus_N$ and $\hat{\oplus}_N$ as defined in equations (1) and (2) as basic building blocks. The $\oplus_N$ and $\hat{\oplus}_N$ operators are binary operators which combine two digital signals, shown as x[k] and y[k] in those equations, where N is a window size.

$$x \oplus_N y[n] \stackrel{def}{=} \sum_{k=0}^{N-1} (x[n-k] + x[n+k-N+1])y[k] \tag{1}$$

$$x \hat{\oplus}_N y[n] \stackrel{def}{=} \sum_{k=0}^{N-1} (x[n-k] + x[n+k-N+1])\mathrm{sgn}(y[k]), \tag{2}$$

$$\mathrm{sgn}(x) \stackrel{def}{=} \begin{cases} -1 & \text{if } x < 0 \\ 0 & \text{if } x = 0. \\ 1 & \text{if } x > 0 \end{cases} \tag{3}$$

$$\mathrm{sgn}(x) \stackrel{def}{=} \begin{cases} -1 & \text{if } x \le 0 \\ 1 & \text{if } x > 0 \end{cases} \tag{4}$$

$$\mathrm{sgn}(x) \stackrel{def}{=} \begin{cases} -1 & \text{if } x < 0 \\ 1 & \text{if } x \ge 0 \end{cases} \tag{5}$$

In equation (2), the signum function sgn(x) can be the traditional signum function as defined in equation (3). However, computational efficiency can be improved by adopting the modified signum function as defined in equations (4) or (5). In order to implement equation (3), some comparison operations are necessary. However the modified signum function can be implemented by extracting the sign bit of the variable x.

The window size N for either of these operators can be chosen on the basis of several factors. The larger the window size the finer the frequency resolution produced by equations (1) or (2). However, the larger the window size the greater the computational complexity needed to evaluate equations (1) or (2). Even though a small window size would have a frequency multiplying effect, the resultant intermodulation and harmonics in a real signal would not produce good results unless the window sizes are sufficiently large.

Figure 6:
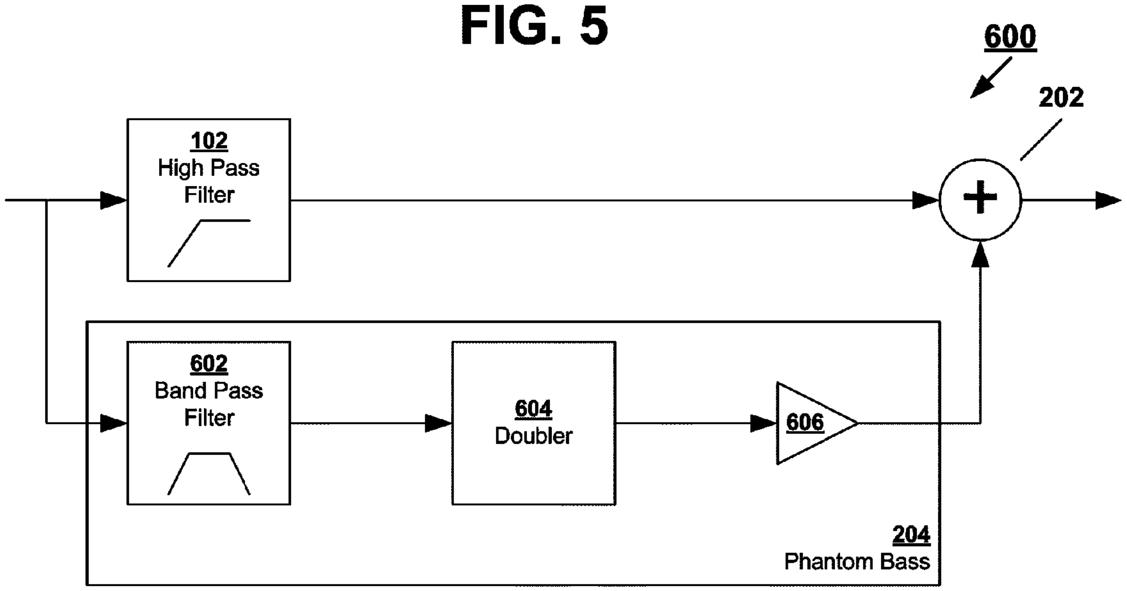
FIG. 6 shows a portion of an audio driver.

FIG. 6 shows a portion of an audio driver. Driver 600 comprises high pass filter 102 and phantom bass module 204. The output of phantom bass module 204 is combined with the filtered audio signal by mixer 202. This embodiment of phantom bass module 204 comprises band pass filter 602 and frequency doubler 604. Band pass filter 602 isolates the frequency components to be doubled as an example, it can be used to pass frequency components between $$\frac{f}{2}$$

and f, where f is the given cutoff frequency. Optionally, gain element 606 can be used to control the amount of doubled frequency components that are added to the audio signal.

Figure 7:
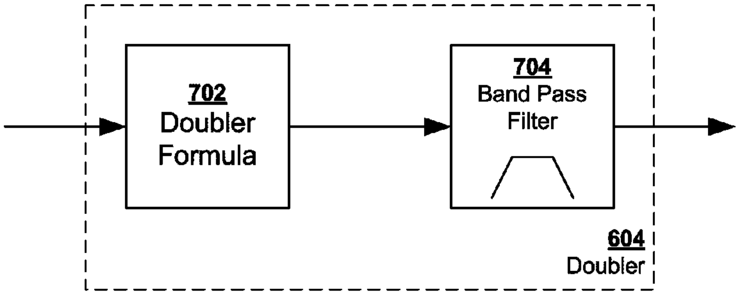
FIG. 7 shows an embodiment of a frequency doubler.

FIG. 7 shows an embodiment of frequency doubler 604. Frequency doubler 604 comprises module 702 which implements the frequency doubling formula given in equation (6) or (7) and band pass filter 704 which permits frequency components between f and 2f.

$$z[n]=(x\oplus_N x)[n] \tag{6}$$

$$z[n]=x\hat{\oplus}_N x)[n] \tag{7}$$

Because for a given frequency in x, $x\oplus_N x$ and $x\hat{\oplus}_N x$ will generate harmonics beyond simply doubling frequency components in x, band pass filter 704 is used to attenuate these harmonics. Because equations (1) and/or (2) can be implemented in real time in the time domain and the band pass filters can be implemented with finite impulse response (FIR) filters, the phantom bass process can take place completely in the time domain and essentially in real time. Generally, $x\oplus_N x$ produces a phantom bass signal with square the power of the original signal, whereas $x\hat{\oplus}_N x$ tends to maintain substantially the same power profile of the original signal.

Figure 8:
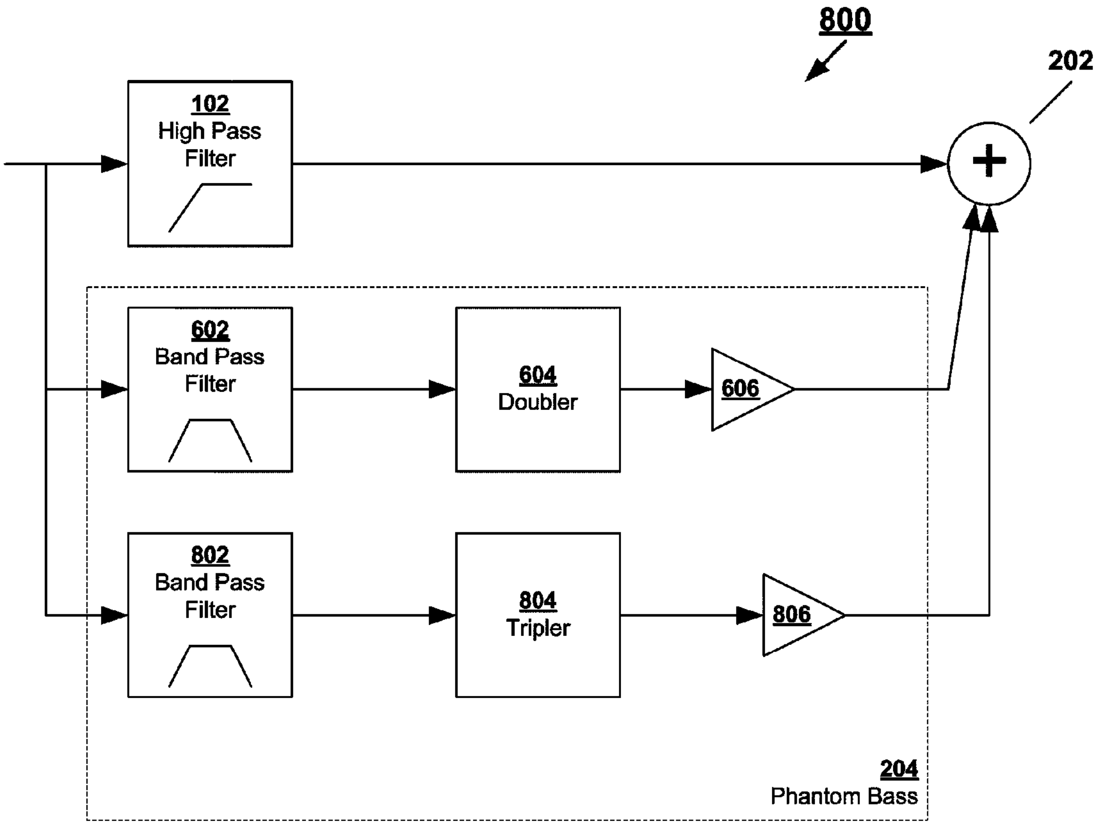
FIG. 8 shows a portion of an audio driver where the phantom bass module utilizes a frequency tripler.

FIG. 8 shows a portion of an audio driver where the phantom bass module utilizes a frequency tripler. Driver 800 comprises high pass filter 102 and phantom bass module 204 as before. In addition to band pass filter 602 and frequency doubler 604, phantom bass module 204 further comprises band pass filter 802 and frequency tripler 804. Band pass filter 802 isolates the frequency components to be tripled as an example, it can be used to pass frequency components between $$\frac{f}{3} \text{ and } \frac{f}{2}.$$

Alternatively, band pass filter 802 can use an alternate upper limit to give richness to the phantom bass, for example, band pass filter 802 could pass frequency components between $$\frac{f}{3} \text{ and } \frac{2f}{3}$$

Optionally, gain element 806 can be used to control the amount of tripled frequency components that are added to the audio signal.

Figure 9:
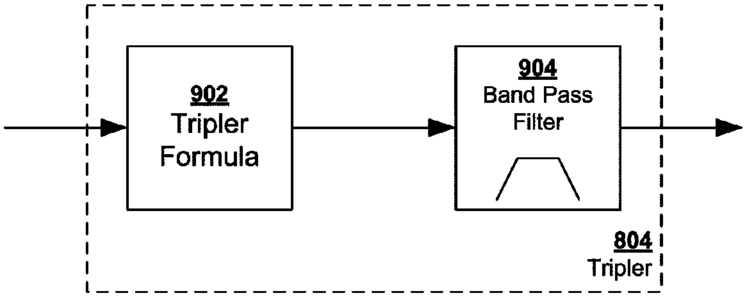
FIG. 9 shows an embodiment of a frequency tripler.

FIG. 9 shows an embodiment of frequency tripler 804. In this embodiment, frequency tripler 804 comprises module 902 which implements a frequency tripling formula such as one given by equations (8)-(15) and band pass filter 904. Equations (8)-(15) enumerate various combinations of $\oplus_N$ and $\hat{\oplus}_N$ operators, resulting from the fact that these operators are not associative. Each equation produces slightly different results, different gains and different non-linear effects, though the overall principle of frequency tripling still holds. For generality, the equations are shown with different window sizes for the operators, (i.e., N and M). These window sizes can be the same but are not required to be. Band pass filter 904 is used to eliminate undesired harmonics and intermodulated signals by suppressing frequency components outside the range of f to $$\frac{3}{2}f.$$

However, an alternate upper bound can be used such as 2f.

$$z[n]=(x\oplus_N(x\oplus_M x))[n] \tag{8}$$

$$z[n]=(x\hat{\oplus}_N(x\oplus_M x))[n] \tag{9}$$

$$z[n]=(x\oplus_N(x\hat{\oplus}_M x))[n] \tag{10}$$

$$z[n]=(x\hat{\oplus}_N(x\hat{\oplus}_M x))[n] \tag{11}$$

$$z[n]=((x\oplus_N x)\oplus_M x)[n] \tag{12}$$

$$z[n]=((x\hat{\oplus}_N x)\oplus_M x)[n] \tag{13}$$

$$z[n]=((x\oplus_N x)\hat{\oplus}_M x)[n] \tag{14}$$

$$z[n]=((x\hat{\oplus}_N x)\hat{\oplus}_M x)[n]. \tag{15}$$

Figure 10:
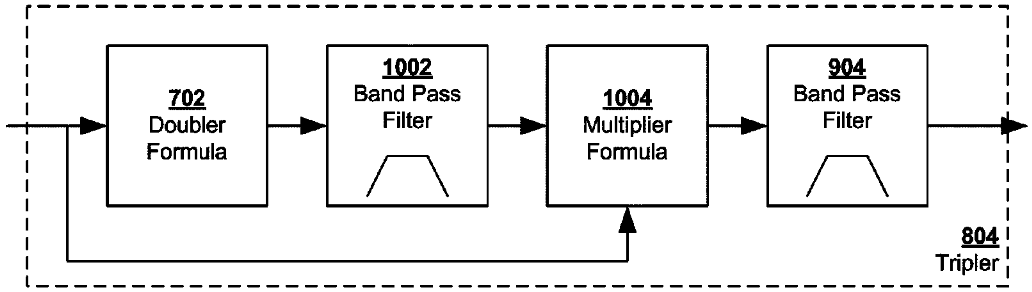
FIG. 10 shows an alternate embodiment of a frequency tripler.

FIG. 10 shows an alternate embodiment of frequency tripler 804. In this embodiment frequency tripler 804 comprises module 702 which implements a frequency doubling formula such as given by equation (16) or (17), band pass filter 1002, multiplier module 1004 which implements a multiplier formula such as given by equations (18)-(21) and band pass filter 904.

$$y[n]=(x\oplus_N x)[n] \tag{16}$$

$$y[n]=(x\hat{\oplus}_N x)[n] \tag{17}$$

$$z[n]=(x\oplus_{N'} y')[n] \tag{18}$$

$$z[n]=(y'\oplus_{N'} x)[n] \tag{19}$$

$$z[n]=(x\hat{\oplus}_{N'} y')[n] \tag{20}$$

$$z[n]=(y'\hat{\oplus}_{N'} x)[n] \tag{21}$$

Equations (16) and (17) are examples of two frequency doubling formulae that can be used in module 702. In this example, the output of module 702 is represented by the signal y. Band pass filter 1002 isolates frequency components to be the doubled for example it can permit frequency components between $$\frac{2f}{3}$$

and f, which is double the frequency components permitted by band pass filter 802. Because frequency doubling formula produces unwanted harmonics, band pass filter 1002 suppresses them. Multiplier module 1004 implements a multiplier formula which combines the frequency components received by the tripler represented by signal x with the frequency components generated as a result of the frequency doubling formula after filtering represented by signal y' which is the filtered version of y. Since the $\oplus_{N'}$ and $\hat{\oplus}_{N'}$ operators are not commutative, equations (18) and (19) are not the same, neither are (20) and (21). It should be noted that the window size, N', for the multiplier formula need not be the same as window size N used in the frequency doubling formula used by module 702, but can be the same. The tripler also comprises band pass filter 904 as described above.

Figure 11:
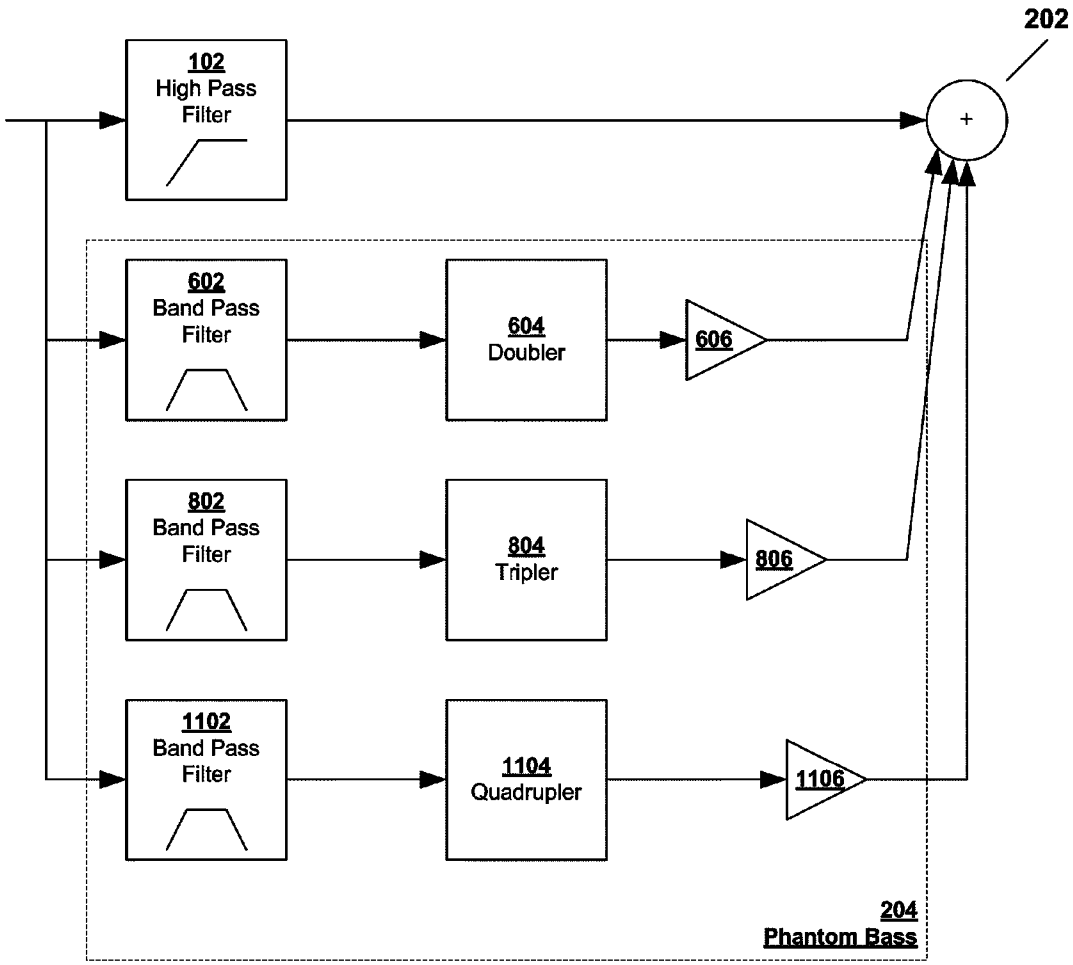
FIG. 11 shows a portion of an audio driver where the phantom bass module utilizes a frequency quadrupler.

FIG. 11 shows a portion of an audio driver where the phantom bass module utilizes a frequency quadrupler. In this embodiment of phantom base module 204 further comprises band pass filter 1102 and frequency quadrupler 1104, where band pass filter 1102 isolates frequency components to be quadrupled. For example, band pass filter 1102 permits frequency components between $$\frac{f}{4} \text{ and } \frac{f}{3}$$

or alternatively, permits frequency components between $$\frac{f}{4} \text{ and } \frac{f}{2}.$$

Optionally, gain element 1106 can be used to control the amount of quadrupled frequency components that are added to the audio signal.

Figure 12:
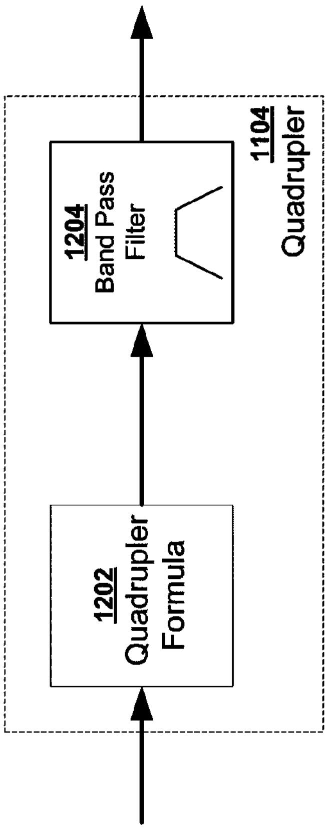
FIG. 12 illustrates an embodiment of a frequency quadrupler.

FIG. 12 illustrates an embodiment of frequency quadrupler 1104. In this embodiment, frequency quadrupler 1104 comprises module 1202 which implements a frequency quadrupling formula such as one given by equations (22)-(69) and band pass filter 1204.

$$z[n]=(x\oplus_N((x\oplus_M x)\oplus_P x))[n] \tag{22}$$

$$z[n]=(x\oplus_N((x\oplus_M x)\hat{\oplus}_P x))[n] \tag{23}$$

$$z[n]=(x\oplus_N((x\hat{\oplus}_M x)\oplus_P x))[n] \tag{24}$$

$$z[n]=(x\oplus_N((x\hat{\oplus}_M x)\hat{\oplus}_P x))[n] \tag{25}$$

$$z[n]=(x\hat{\oplus}_N((x\oplus_M x)\oplus_P x))[n] \tag{26}$$

$$z[n]=(x\hat{\oplus}_N((x\oplus_M x)\hat{\oplus}_P x))[n] \tag{27}$$

$$z[n]=(x\hat{\oplus}_N((x\hat{\oplus}_M x)\oplus_P x))[n] \tag{28}$$

$$z[n]=(x\hat{\oplus}_N((x\hat{\oplus}_M x)\hat{\oplus}_P x))[n] \tag{29}$$

$$z[n]=(((x\oplus_N x)\oplus_M x)\oplus_P x)[n] \tag{30}$$

$$z[n]=(((x\oplus_N x)\oplus_M x)\hat{\oplus}_P x)[n] \tag{31}$$

$$z[n]=(((x\oplus_N x)\hat{\oplus}_M x)\oplus_P x)[n] \tag{32}$$

$$z[n]=(((x\oplus_N x)\hat{\oplus}_M x)\hat{\oplus}_P x)[n] \tag{33}$$

$$z[n]=(((x\hat{\oplus}_N x)\oplus_M x)\oplus_P x)[n] \tag{34}$$

$$z[n]=(((x\hat{\oplus}_N x)\oplus_M x)\hat{\oplus}_P x)[n] \tag{35}$$

$$z[n]=(((x\hat{\oplus}_N x)\hat{\oplus}_M x)\oplus_P x)[n] \tag{36}$$

$$z[n]=(((x\hat{\oplus}_N x)\hat{\oplus}_M x)\hat{\oplus}_P x)[n] \tag{37}$$

$$z[n]=(x\oplus_N(x\oplus_M(x\oplus_P x)))[n] \tag{38}$$

$$z[n]=(x\oplus_N(x\oplus_M(x\hat{\oplus}_P x)))[n] \tag{39}$$

$$z[n]=(x\oplus_N(x\hat{\oplus}_M(x\oplus_P x)))[n] \tag{40}$$

$$z[n]=(x\oplus_N(x\hat{\oplus}_M(x\hat{\oplus}_P x)))[n] \tag{41}$$

$$z[n]=(x\hat{\oplus}_N(x\oplus_M(x\oplus_P x)))[n] \tag{42}$$

$$z[n]=(x\hat{\oplus}_N(x\oplus_M(x\hat{\oplus}_P x)))[n] \tag{43}$$

$$z[n]=(x\hat{\oplus}_N(x\hat{\oplus}_M(x\oplus_P x)))[n](44)$$

$$z[n]=(x\hat{\oplus}_N(x\hat{\oplus}_M(x\hat{\oplus}_P x)))[n] \tag{45}$$

$$z[n]=(x\oplus_N(x\oplus_M(x\oplus_P x)))[n] \tag{46}$$

$$z[n]=(x\oplus_N(x\oplus_M(x\hat{\oplus}_P x)))[n] \tag{47}$$

$$z[n]=(x\oplus_N(x\hat{\oplus}_M(x\oplus_P x)))[n] \tag{48}$$

$$z[n]=(x\oplus_N(x\hat{\oplus}_M(x\hat{\oplus}_P x)))[n] \tag{49}$$

$$z[n]=(x\hat{\oplus}_N(x\oplus_M(x\oplus_P x)))[n] \tag{50}$$

$$z[n]=(x\oplus_N(x\oplus_M(x\hat{\oplus}_P x)))[n] \tag{51}$$

$$z[n]=(x\hat{\oplus}_N(x\hat{\oplus}_M(x\oplus_P x)))[n] \tag{52}$$

$$z(n)=(x\hat{\oplus}_N(x\hat{\oplus}_M(x\hat{\oplus}_P x)))[n] \tag{53}$$

$$z[n]=((x\oplus_N(x\oplus_M x))\oplus_P x)[n] \tag{54}$$

$$z(n)=((x\oplus_N(x\oplus_M x))\hat{\oplus}_P x)[n] \tag{55}$$

$$z[n]=((x\oplus_N(x\hat{\oplus}_M x))\oplus_P x)[n] \tag{56}$$

$$z(n)=((x\oplus_N(x\hat{\oplus}_M x))\hat{\oplus}_P x)[n] \tag{57}$$

$$z[n]=((x\hat{\oplus}_N(x\oplus_M x))\oplus_P x)[n] \tag{58}$$

$$z(n)=((x\hat{\oplus}_N(x\oplus_M x))\hat{\oplus}_P x)[n] \tag{59}$$

$$z[n]=((x\hat{\oplus}_N(x\hat{\oplus}_M x))\oplus_P x)[n] \tag{60}$$

$$z(n)=((x\hat{\oplus}_N(x\hat{\oplus}_M x))\hat{\oplus}_P x)[n] \tag{61}$$

$$z[n]=((x\oplus_N x)\oplus_M(x\oplus_P x))[n] \tag{62}$$

$$z(n)=((x\oplus_N x)\oplus_M(x\hat{\oplus}_P x))[n] \tag{63}$$

$$z[n]=((x\oplus_N x)\hat{\oplus}_M(x\oplus_P x))[n] \tag{64}$$

$$z(n)=((x\oplus_N x)\hat{\oplus}_M(x\hat{\oplus}_P x))[n] \tag{65}$$

$$z[n]=((x\hat{\oplus}_N x)\oplus_M(x\oplus_P x))[n] \tag{66}$$

$$z(n)=((x\hat{\oplus}_N x)\oplus_M(x\hat{\oplus}_P x))[n] \tag{67}$$

$$z[n]=((x\hat{\oplus}_N x)\hat{\oplus}_M(x\oplus_P x))[n] \tag{68}$$

$$z(n)=((x\hat{\oplus}_N x)\hat{\oplus}_M(x\hat{\oplus}_P x))[n] \tag{69}$$

Because of the lack of associativity and commutativity of the $\oplus$ and $\hat{\oplus}$ operators, numerous unique formulae are possible, all of which produce similar results, but with different gains, and different non-linear effects. As a general description, all these formulas comprise either the $\oplus_N$ operator or the $\hat{\oplus}_N$ operator, either the $\oplus_M$ operator or the $\hat{\oplus}_M$ operator, and either the $\oplus_P$ operator or the $\hat{\oplus}_P$ operator. Furthermore, the choice of window sizes N, M, and P need not be the same, but for convenience they often are chosen to be the same. Band pass filter 1202 isolates the desired phantom bass frequency components after quadrupling. Common examples are that band pass filter 1202 permits frequency components between f and $$\frac{4f}{3}$$

or frequency components between f and 2f.

Figure 13:
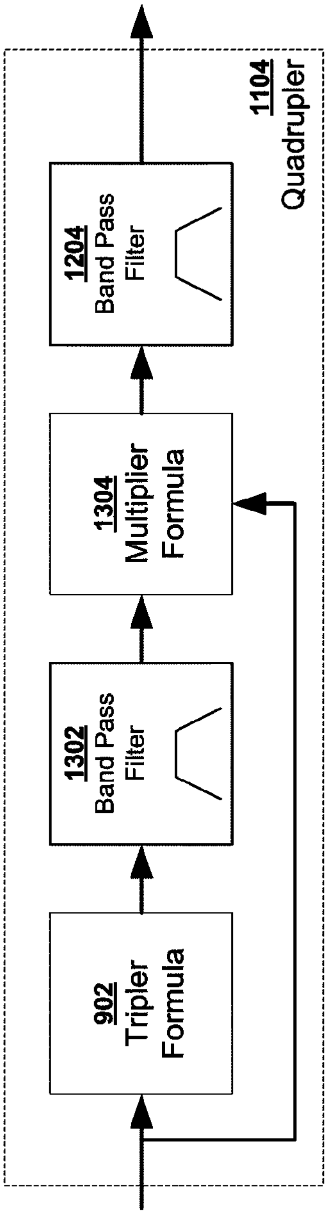
FIG. 13 shows an alternate embodiment of a frequency quadrupler.

FIG. 13 shows an alternate embodiment of frequency quadrupler 1104. In this embodiment, frequency quadrupler 1104 comprises module 902, which implements a frequency tripling formula such as given in equations (70)-(77), band pass filter 1302, module 1304 which implements a frequency multiplier formula such as given in equations (18)-(21) and band pass filter 1204.

$$y[n]=(x\oplus_N(x\oplus_M x))[n] \tag{70}$$

$$y[n]=(x\hat{\oplus}_N(x\oplus_M x))[n] \tag{71}$$

$$y[n]=(x\oplus_N(x\hat{\oplus}_M x))[n] \tag{72}$$

$$y[n]=(x\hat{\oplus}_N(x\hat{\oplus}_M x))[n] \tag{73}$$

$$y[n]=((x\oplus_N x)\oplus_M x)[n] \tag{74}$$

$$y[n]=((x\hat{\oplus}_N x)\oplus_M x)[n] \tag{75}$$

$$y[n]=((x\oplus_N x)\hat{\oplus}_M x)[n] \tag{76}$$

$$y[n]=((x\hat{\oplus}_N x)\hat{\oplus}_M x)[n] \tag{77}$$

Module 902 can implement a frequency tripling formula comprising either the $\oplus_N$ operator or the $\hat{\oplus}_N$ operator and either the $\oplus_M$ operator or the $\hat{\oplus}_M$ operator similar to those described above for FIG. 9. The output of the module 902 represented by signal y is filtered by band pass filter 1302 which permits select frequency components such $$\frac{3f}{4}$$

and f or between $$\frac{3f}{4} \text{ and } \frac{3f}{2}.$$

Module 1304 implements a multiplier formula as described above which combines the output of module 902 represented by signal y' and the input to the quadrupler represented here by the signal x. The window sizes N, M and N' used in module 902 and module 1304 can be different but are often chosen to be the same. Finally, band pass filter 1204 permits frequency components desired in the final phantom bass output as previously described.

Figure 14:
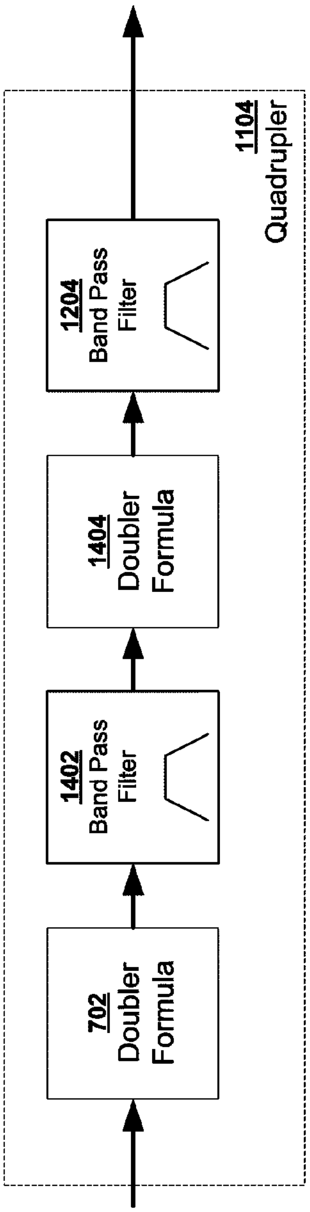
FIG. 14 shows yet another embodiment of a frequency quadrupler.

FIG. 14 shows yet another embodiment of frequency quadrupler 1104. In this embodiment, frequency quadrupler 1104 comprises module 702, which implements a frequency doubling formula such as given by equation (16) or (17), band pass filter 1402, module 1404 which implements a second frequency doubling formula, such as given by equation (78) or (79) and band pass filter 1204.

$$z[n]=(y'\oplus_M y')[n] \tag{78}$$

$$z[n]=(y'\hat{\oplus}_M y')[n] \tag{79}$$

In this example, the output of module 702 is represented by signal y which is then filtered by band pass filter 1402 with an output represented by signal y'. Band pass filter 1402 is used to suppress undesired harmonics resultant from module 702. Common pass bands implemented by band pass filter 1402 include $$\frac{f}{2} \text{ to } \frac{2f}{3} \text{ and } \frac{f}{2}$$

to f which are typically double the pass band frequencies of band pass filter 1102. Module 1404 applies the second frequency doubling to the output of band pass filter 1402 represented by signal y'. Once again, window sizes N and M used in module 702 and module 1404 can be different but are often chosen to be the same. Finally, the output of module 1404, represented by signal z, is filtered by band pass filter 1204.

Figure 15:
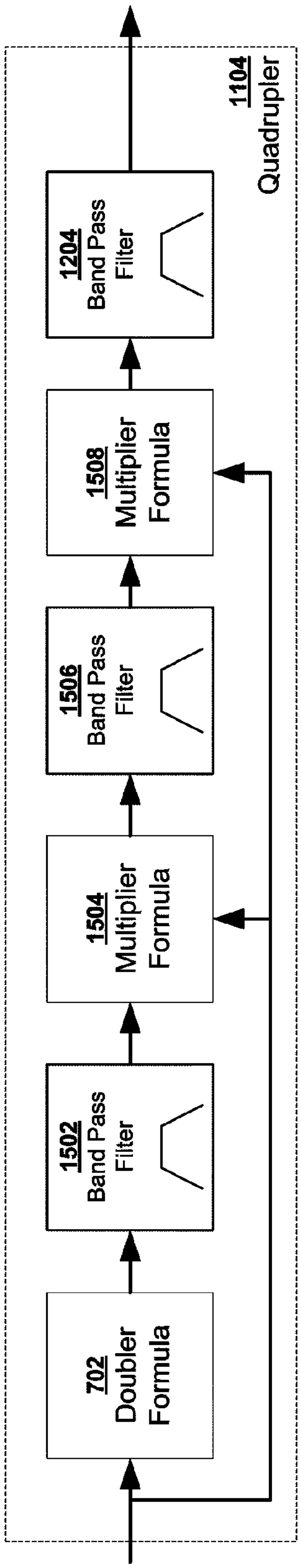
FIG. 15 shows yet another embodiment of a frequency quadrupler.

FIG. 15 shows yet another embodiment of frequency quadrupler 1104. In this embodiment, frequency quadrupler 1104 comprises module 702, which implements a frequency doubling formula such as given by equation (16) or (17), band pass filter 1502, multiplier module 1504 implements a multiplier formula, such as given by equation (80)-(83), band pass filter 1506, multiplier module 1508 which implements a second multiplier formula such as given by equations (84)-(87) and band pass filter 1204.

$$w[n]=(x\oplus_{N'} y')[n] \tag{80}$$

$$w[n]=(y'\oplus_{N'} x)[n] \tag{81}$$

$$w[n]=(x\hat{\oplus}_{N'} y')[n] \tag{82}$$

$$w[n]=(y'\hat{\oplus}_{N'} x)[n] \tag{83}$$

$$z[n]=(x\oplus_{N''} w')[n] \tag{84}$$

$$z[n]=(w'\oplus_{N''} x)[n] \tag{85}$$

$$z[n]=(x\hat{\oplus}_{N''} w')[n] \tag{86}$$

$$z[n]=(w'\hat{\oplus}_{N''} x)[n] \tag{87}$$

Module 702 produces output signal y. Band pass filter 1502 removes undesired harmonics. Common pass bands implemented by band pass filter 1502 include $$\frac{f}{2} \text{ to } \frac{2f}{3} \text{ and } \frac{f}{2}$$

to f which are typically double the pass band frequencies of band pass filter 1102. Multiplier module 1504 applies a multiplier formula, such as given by equation (80)-(83) to input signal x and y' which is the output of band pass filter 1502. Band pass filter 1506 removes undesired harmonics resultant from the output, represented by signal w, of multiplier module 1504. Common pass bands implemented by band pass filter 1506 include $$\frac{3f}{4}$$

to f and $$\frac{3f}{4} \text{ to } \frac{3f}{2},$$

which are typically triple the pass band frequencies of band pass filter 1102. Multiplier module 1508 applies a multiplier formula such as given by equations (84)-(87) to input signal x and the output of band pass filter 1506, represented by signal w'. Furthermore, the window sizes N,N' and N" need not be the same, but are often chosen to be the same. Band pass filter 1204 as described above suppresses undesired harmonics in output signal z, as generated by multiplier module 1508.

While usually, doubling and tripling and sometimes quadrupling are sufficient to give the desired phantom bass effect, the principles described here can be applied to quintupling and so forth. As the multiplicative factor increase, the more combinations are possible.

The time domain approach is significantly faster than an FFT approach even for comparable window sizes. This is chiefly due to the reduction of multiplication operations. However, when the bass frequencies to be doubled, tripled, etc are small, such as 200 Hz. The isolated signals are severely oversampled. For example, an audio signal may be represented by a sampling rate of 48 kHz. When considering frequency doubling, if the cutoff frequency f is 200 Hz, the frequencies even after doubling would only attain at most 400 Hz. Because only 800 samples per second are needed to represent signals of 400 Hz or less, the signal provided by band pass filter 602 in FIG. 6 would be oversampled by 60 times. Downsampling the output of band pass filter 602 prior to frequency doubling can result in extremely significant computational savings. In the preceding example, a downsampled sampling rate of 1.2 kHz is sufficient to preserve the bass signal even beyond the cutoff range. This downsampled sampling rate enables a savings of 40 fold in computation.

Figure 16:
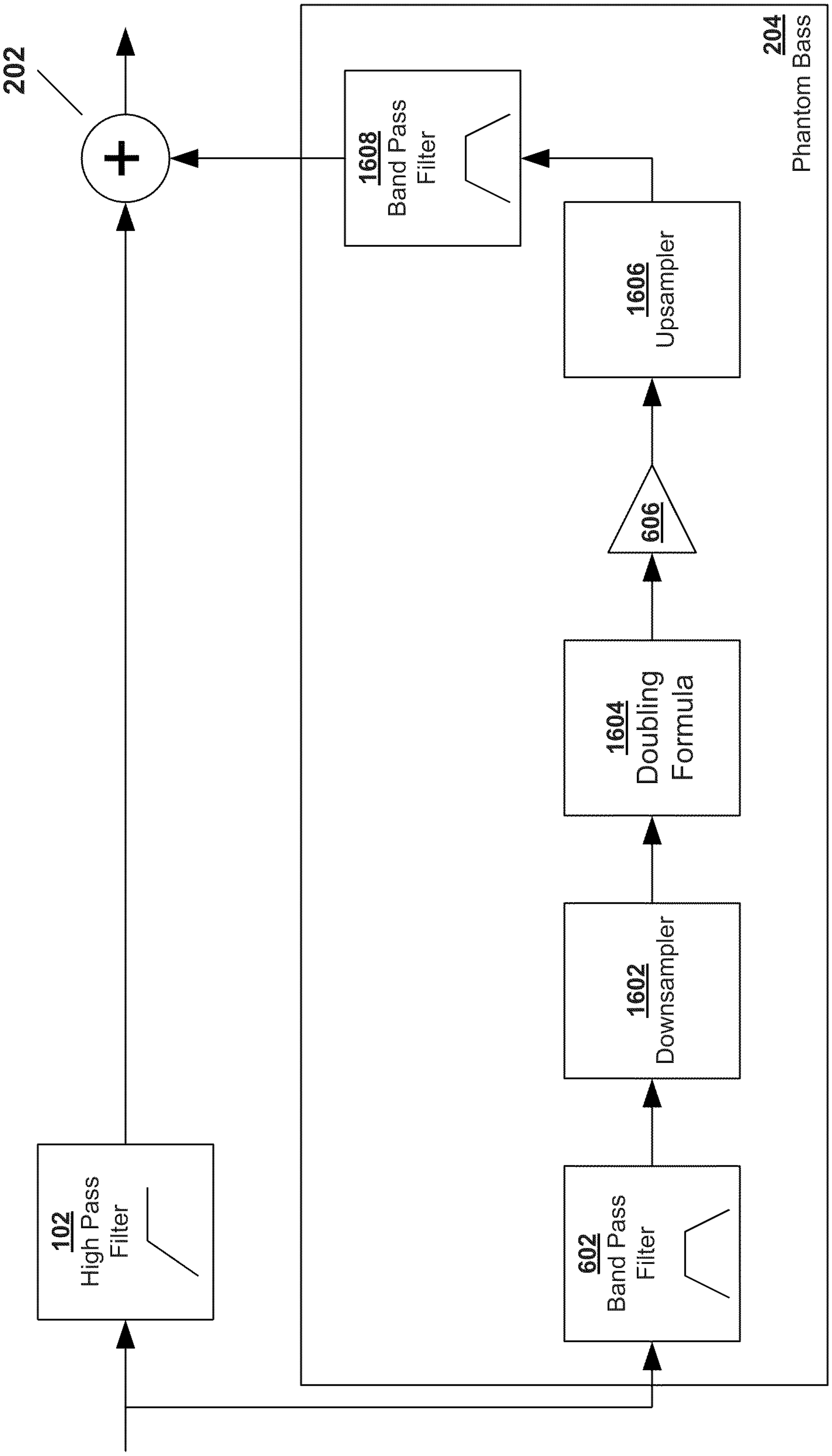
FIG. 16 illustrates an embodiment of an audio driver using phantom bass and bass downsampling.

FIG. 16 illustrates an embodiment of an audio driver using phantom bass and bass downsampling. Specifically, the audio driver comprises an embodiment of phantom bass module 204 which in turn comprises band pass filter 602 as described above, downsampler 1602, module 1604 which applies a frequency doubling formula, upsampler (or interpolator) 1606 and band pass filter 1608. Optionally, gain element 606 can be used to apply gain or attenuation to the resultant phantom bass signal. Band pass filter 602 isolates the frequency components to be doubled. Common band pass ranges are described above. Downsampler 1602 downsamples the isolated bass signal for example by a factor of D. Module 1604 applies a frequency doubling formula similar to that used in module 702, except the input to module 1604 is downsampled compared to the input to module 702. Because the input signal has been downsampled, the window size used can also be scaled down by D. Therefore, a window size of N/D is used when compared to module 702. The frequency doubling formula used can now be represented as (88) or (89). Upsampler 1606 can upsample the sampling rate back to the original sampling rate used. Conventional upsampling methods can be used such as zero-padding or interpolation. Finally, band pass filter 1608 not only suppresses undesirable harmonics generated by the frequency doubling formula, but also serves an anti-aliasing function for potential aliasing created by upsampler 1606. While serving both functions, band pass filter 1608 can still maintain the same pass band as band pass filter 704 described above. It should be noted that upsampler 1606 and band pass filter 1608 can also be combined as a poly phase filter.

$$y[n]=(x\oplus_{N/D}x)[n] \tag{88}$$

$$y[n]=x\hat{\oplus}_{N/D}x)[n] \tag{89}$$

Figure 17:
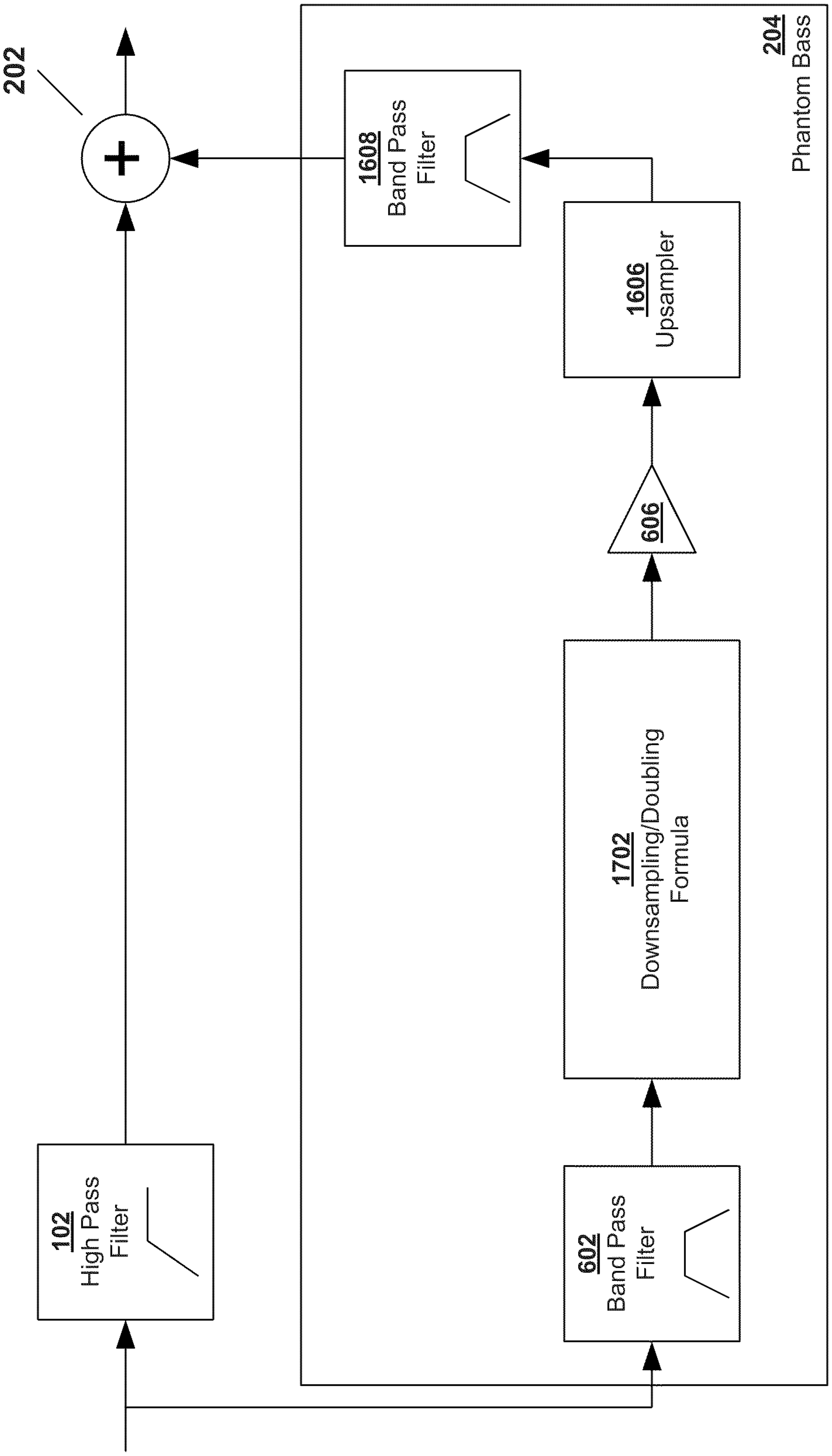
FIG. 17 illustrates an embodiment of an audio driver using phantom bass and bass downsampling.

FIG. 17 illustrates an embodiment of an audio driver using phantom bass and bass downsampling. This embodiment of phantom bass module 204 differs in that the downsampling and the frequency doubling formula are performed by module 1702 rather than in two steps. As a result a combined downsampling and frequency doubling formula can be used resulting in the formula given in equations (90) and (91).

$$y[n] = \sum_{k=0}^{\frac{N}{D}-1} (x[D(n-)] + x[D(n+k) - N + D])x[kD] \tag{90}$$

$$y[n] = \sum_{k=0}^{\frac{N}{D}-1} (x[D(n-k)] + x[D(n+k) - N + D])\mathrm{sgn}(x[kD]) \tag{91}$$

In this example, the input signal is represented by x and the output of module 1702 is represented by y.

Figure 18:
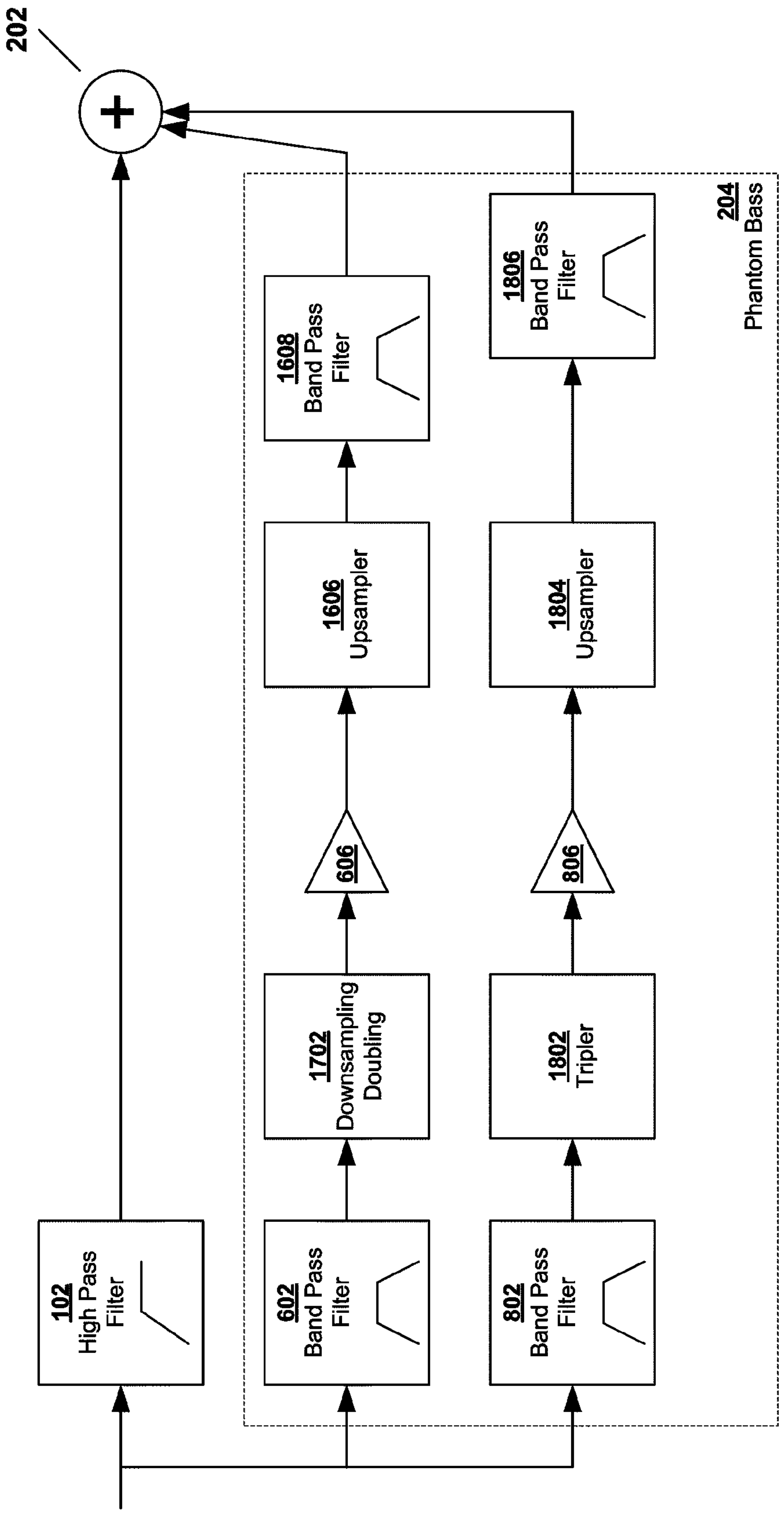
FIG. 18 illustrates an embodiment of an audio driver using phantom bass and bass downsampling.

FIG. 18 illustrates an embodiment of an audio driver using phantom bass and bass downsampling. In this embodiment phantom bass module 204, in addition to band pass filter 602, module 1702 for downsampling and frequency doubling, optional gain element 606, upsampler 1606 and band pass filter 1608, comprises a tripler path comprising band pass filter 802, frequency tripler 1802, optional gain element 806, upsampler 1804 and band pass filter 1806. As described before, band pass filter 802 isolates those frequencies to be tripled. Frequency tripler 1802 downsamples the resultant isolated signal and triples the frequency of the downsampled isolated signal. Upsampler 1804 upsamples the processed signal back to the original sampling rate. Band pass filter 1806 not only suppressed undesirable harmonics produced by frequency tripler 1802 it also serves as an anti-aliasing filter to counteract the aliasing of upsampler 1804. The pass band can be triple the frequencies allowed by band pass filter 802. There are several embodiments of tripler 1802. It can implement a downsampled version of a frequency tripling formula such as a downsampled variant of (8)-(15) which would be the downsampled analogue of the embodiment of frequency tripler 804 shown in FIG. 9. It can also be a downsampled analogue of the embodiment of frequency tripler 804 shown in FIG. 10. In addition, upsampler 1804 and band pass filter 1806 can be combined into a poly phase filter.

Figure 19:
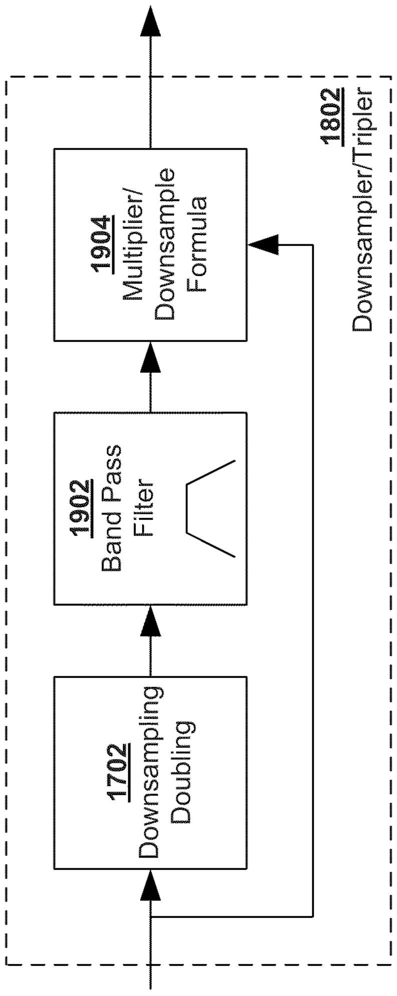
FIG. 19 shows an embodiment of a frequency tripler.

FIG. 19 shows an embodiment of frequency tripler 1802. In this embodiment, frequency tripler 1802 comprises module 1702 which implements a formula such as equations (90) and (91) that simultaneously downsamples an input signal and doubles the frequency, band pass filter 1902 which is used to suppress undesirable harmonics generated from the frequency doubling, and module 1904 which applies a multiplier formula that combines the input signal with the frequency doubled signal to produce a frequency tripled signal. Band pass filter 1902 unlike the other band pass filters in the system is designed to operate at the lower sampling rate. In addition, the multiplier formula used in module 1904 is a little more complicated. Module 1904 receives an input signal represented by signal x, which is not downsampled with the output of band pass filter 1902 represented by signal y', which is the filtered version of the output of module 1702 represented by signal y. Signals y and y' have a sampling rate which is the downsampled sampling rate whereas signal x has the original sampling rate. As a result, the multiplier formula used does not alter the sampling rate of y', but downsamples x. Examples of such a multiplier formula are given in equations (92)-(95).

$$z[n] = \sum_{k=0}^{\frac{N}{D}-1} \left(y[n-k] + y\left[n+k-\frac{N}{D}+1\right]\right)x[kD] \tag{92}$$

-continued $$z[n]=\sum_{k=0}^{\frac{N}{D}-1}\left(y[n-k]+y\left[n+k-\frac{N}{D}+1\right]\right)\text{sgn}(x[kD]) \tag{93}$$

$$z[n]=\sum_{k=0}^{\frac{N}{D}-1}(x[D(n-k)]+x[D(n+k)-N+D])y[k] \tag{94}$$

$$z[n]=\sum_{k=0}^{\frac{N}{D}-1}(x[D(n-k)]+x[D(n+k)-N+D])\text{sgn}(y[k]) \tag{95}$$

The principle of downsampling bass in combination with frequency multiplying can be applied to all the preceding examples of phantom bass including the use of a quadrupler. In addition, the principle can be applied to higher order frequency multiplication if desired.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. An audio driver comprising:

a high pass filter operable to receive and filter an audio signal;

a phantom bass module operable to generate an output signal and comprising:

a first band pass filter operable to receive the audio signal;

a doubler module operable to apply a frequency doubling formula having an input signal x and an output signal z;

a second band pass filter operable to filter the output signal z of the frequency doubling formula;

a mixer operable to add the filtered output signal z of the frequency doubling formula to the audio signal;

a digital to analog converter (DAC); and an amplifier, wherein the frequency doubling formula is either $z[n]=(x\oplus_N x)[n]$ or $z[n]=(x\ \hat{\oplus}_N x)[n]$, where N is a window size.

2. In the audio driver of claim 1, the phantom bass module further comprises a first gain element operable to receive a signal from the first band pass filter.

3. In the audio driver of claim 1, phantom bass module further comprises a downsampler operable to downsample the audio signal filtered by the first band pass filter; and an upsampler operable to upsample the output signal z.

4. In the audio driver of claim 1 the phantom bass module further comprises a frequency tripler.

5. In the audio driver of claim 4 the phantom bass module further comprises a second gain element coupled to the frequency tripler.

6. In the audio driver of claim 4 the frequency tripler further comprises:

a third band pass filter;

a tripler module operable to apply a frequency tripling formula having an input signal x and an output signal z;

a fourth band pass filter operable to filter the output signal z;

wherein the tripling formula is one of the following equations, $$z[n]=(x\oplus_N(x\oplus_M x))[n],\ z[n]=(x\oplus_N(x\hat{\oplus}_M x))[n],$$

$$z[n]=(x\oplus_N(x\hat{\oplus}_M x))[n],\ z[n]=(x\hat{\oplus}_N(x\hat{\oplus}_M x))[n],$$

$$z[n]=((x\oplus_N x)\oplus_M x)[n],\ z[n]=((x\hat{\oplus}_N x)\oplus_M x)[n],$$

$$z[n]=((x\oplus_N x)\hat{\oplus}_M x)[n],\ z[n]=((x\hat{\oplus}_N x)\hat{\oplus}_M x)[n],$$

where N and M are window sizes.

7. In the audio driver of claim 4 the frequency tripler further comprises:

a third band pass filter;

a doubler module operable to apply a frequency doubling formula having an input signal x and an output signal y;

a fourth band pass filter operable to filter the output signal y;

a multiplier module operable to apply a multiplier formula receiving the input signal x and an output signal y' from the fourth band pass filter and having an output signal z, wherein the frequency doubling formula is either $y[n]=(x\oplus_N x)[n]$ or $y[n]=(x\hat{\oplus}_N x)[n]$, and the multiplier formula is either $z=(x\oplus_{N'} y')[n]$ or $z=(x\hat{\oplus}_{N'} y')[n]$ or $z=(y'\oplus_{N'} x)[n]$ or $z=(y'\hat{\oplus}_{N'} x)[n]$, where N and N' are window sizes.

8. In the audio driver of claim 3 the phantom bass module further comprises a frequency quadrupler.

9. In the audio driver of claim 8 the phantom bass module further comprises a third gain element coupled to the frequency quadrupler.

10. In the audio driver of claim 8 the frequency quadrupler further comprises:

a fifth band pass filter;

a quadrupler module operable to apply a frequency quadrupling formula having an input signal x and an output signal z;

a sixth band pass filter operable to filter the output signal z, wherein the quadrupling formula is comprising either a $\oplus_N$ operator, a $\hat{\oplus}_N$ operator, a $\oplus_M$ operator or a $\hat{\oplus}_M$ operator; a $\oplus_P$ operator or a $\hat{\oplus}_P$ operator.

11. In the audio driver of claim 8 the frequency quadrupler further comprises:

a fifth band pass filter;

a tripler module operable to apply a frequency quadrupling formula having an input signal x and an output signal y;

a sixth band pass filter operable to filter the output signal y;

a multipler module operable to apply a multiplier formula receiving the input signal x and an output signal y' from the sixth band pass filter and having an output signal z;

a seventh band pass filter operable to filter the output signal z;

wherein the tripling formula is one of the following equations, $$y[n]=(x\oplus_N(x\oplus_M x))[n],\ y[n]=(x\hat{\oplus}_N(x\oplus_M x))[n],$$

$$y[n]=(x\oplus_N(x\hat{\oplus}_M x))[n],\ y[n]=(x\hat{\oplus}_N(x\hat{\oplus}_M x))[n],$$

$$y[n]=((x\oplus_N x)\oplus_M x)[n],\ y[n]=((x\hat{\oplus}_N x)\oplus_M x)[n],$$

$y[n]=((x\oplus_N x)\hat{\oplus}_M x)[n]$, $y[n]=((x\hat{\oplus}_N x)\hat{\oplus}_M x)[n]$, and the multiplier formula is either $z=(x\oplus_{N'} y')[n]$ or $z=(x\hat{\oplus}_{N'} y')[n]$ or $z=(y'\oplus_{N'} x)[n]$ or $z=(y'\hat{\oplus}_{N'} x)[n]$ where N, M and N' are window sizes.

12. In the audio driver of claim 8 the frequency quadrupler further comprises:

a fifth band pass filter;

a first doubler module operable to apply a first frequency doubling formula having an input signal x and an output signal y;

a sixth band pass filter operable to filter the output signal;

a second doubler module operable to apply a second frequency doubling receiving an output signal y' from the six band pass filter and having an output signal z;

a seventh band pass filter operable to filter the output signal z;

wherein the first frequency doubling formula is either $y[n]=(x \oplus_N x)[n]$ or $y[n]=(x \hat{\oplus}_N x)[n]$, and the second frequency doubling formula is either $z[n]=(y' \oplus_M y')[n]$ or $z[n]=(y' \hat{\oplus}_M y')[n]$, where N and M are window sizes.

13. In the audio driver of claim 8 the frequency quadrupler further comprises:

a fifth band pass filter;

a first doubler module operable to apply a first frequency doubling formula having an input signal x and an output signal y;

a sixth band pass filter operable to filter the output signal y;

a multiplier module operable to apply a first multiplier formula receiving the input signal x and the output signal y' from the sixth band pass filter and having an output signal w, a seventh band pass filter operable to filter the output signal w, a multiplier module operable to apply a second multiplier formula receiving the input signal x and the output signal w' from the seventh band pass filter and having an output signal z, and an eighth band pass filter operable to filter the output signal z.

wherein the frequency doubling formula is either $y[n]=(x \oplus_N x)[n]$ or $y[n]=(x \hat{\oplus}_N x)[n]$, the first multiplier formula is either $w=(x \oplus_{N'} y')[n]$ or $w=(x \hat{\oplus}_{N'} y')[n]$ or $w=(y' \oplus_{N'} x)[n]$ or $w=(y' \hat{\oplus}_{N'} x)[n]$, and the second multiplier formula is either $z=(x \oplus_{N''} w')[n]$ or $z=(x \hat{\oplus}_{N''} w')[n]$ or $z=(w' \oplus_{N''} x)[n]$ or $z=(w' \hat{\oplus}_{N''} x)[n]$, where N, N' and N" are window sizes.

14. A method of generating phantom bass comprising:

isolating a first range of frequency components to be frequency doubled from an input signal;

doubling the input signal after isolating the first range of frequency components to produce a first output signal y by applying the equation $y[n]=(x \oplus_N x)[n]$ or $y[n]=(x \hat{\oplus}_N x)[n]$ where x are the input signal; and isolating a second range of frequency components from the first output signal.

15. The method of claim 14 wherein the method further comprises:

downsampling the input signal after isolating the first range of frequency components; and upsampling the first output signal.

16. The method of claim 14 further comprising:

isolating a third range of frequency components to be frequency tripled from an input signal;

tripling the input signal after isolating the third range of frequency components to produce a second output signal;

isolating a forth range of frequency components from the second output signal; and combining the second output signal and the first output signal.

17. The method of claim 16 wherein the method further comprises:

downsampling the input signal after isolating the third range of frequency components; and upsampling the second output signal.

18. The method of claim 16 further comprising:

isolating a fifth range of frequency components to be frequency quadrupled from an input signal;

quadrupling the input signal after isolating the fifth range of frequency components to produce a third output signal;

isolating a sixth range of frequency components from the third output signal; and combining the third output signal, the second output signal and the first output signal.

19. The method of claim 18 wherein the method further comprises:

downsampling the input signal after isolating the fifth range of frequency components; and upsampling the third output signal.

* * * * *

UNITED STATES PATENT AND TRADEMARK OFFICE

CERTIFICATE OF CORRECTION

PATENT NO. : 8,638,953 B2
APPLICATION NO. : 12/833606
DATED : January 28, 2014
INVENTOR(S) : Ragnar H. Jonsson, Trausti Thormundsson and Harry K. Lau It is certified that error appears in the above-identified patent and that said Letters Patent is hereby corrected as shown below:

In the Claims

Column 16, line 42, replace the first "," with "or"

Signed and Sealed this
Twenty-seventh Day of May, 2014

Michelle K. Lee
*Deputy Director of the United States Patent and Trademark Office*